United States Patent
Xie

(10) Patent No.: US 11,158,653 B1
(45) Date of Patent: Oct. 26, 2021

(54) METHOD OF MANUFACTURING DISPLAY PANEL AND THE DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Huafei Xie, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 195 days.

(21) Appl. No.: 16/622,479

(22) PCT Filed: Nov. 8, 2019

(86) PCT No.: PCT/CN2019/116759
§ 371 (c)(1),
(2) Date: Dec. 13, 2019

(87) PCT Pub. No.: WO2021/082064
PCT Pub. Date: May 6, 2021

(30) Foreign Application Priority Data

Oct. 28, 2019 (CN) .......................... 201911028011.X

(51) Int. Cl.
*H01L 27/14* (2006.01)
*H01L 27/12* (2006.01)

(52) U.S. Cl.
CPC .......... *H01L 27/124* (2013.01); *H01L 27/127* (2013.01); *H01L 27/1248* (2013.01)

(58) Field of Classification Search
CPC .. H01L 27/124; H01L 27/1248; H01L 27/127
(Continued)

(56) References Cited

U.S. PATENT DOCUMENTS

| | | | |
|---|---|---|---|
| 10,600,671 B2 * | 3/2020 | Bower | .................... H01L 33/62 |
| 2007/0187731 A1 | 8/2007 | Chang | |

(Continued)

FOREIGN PATENT DOCUMENTS

| | | |
|---|---|---|
| CN | 1961413 A | 5/2007 |
| CN | 101345218 A | 1/2009 |

(Continued)

*Primary Examiner* — Tan N Tran
(74) *Attorney, Agent, or Firm* — Osha Bergman Watanabe & Burton LLP

(57) ABSTRACT

A method of manufacturing a display panel is that when the preparation of a front side of the display panel is finished, a structure composed of a protective layer, a sacrificial layer, a planarization layer, and a passivation layer is introduced as a protective film. The protective film structure does not contaminate vacuum equipment such as CVD or PVD. Moreover, the protective film structure has characteristics of hardness and abrasion resistance, so it does not produce residual stripper on the conveyor and does not interfere with the manufacturing process for the back side of the display panel. Moreover, the flatness of a surface of the film layer formed by CVD and coating machine is conducive to transfer and adsorption. The protective film may be completely removed by the means of LLO and dry-etching. The method of the process can effectively realize the double-sided process for single glass.

9 Claims, 2 Drawing Sheets

(58) Field of Classification Search
USPC .......................................... 257/59, 72, 432
See application file for complete search history.

(56) References Cited

U.S. PATENT DOCUMENTS

2009/0015760 A1  1/2009  Hattori et al.
2019/0326271 A1  10/2019  Chi et al.
2020/0027938 A1  1/2020  Song et al.

FOREIGN PATENT DOCUMENTS

| CN | 109216427 A | 1/2019 |
| CN | 109326624 A | 2/2019 |
| CN | 110010627 A | 7/2019 |

* cited by examiner

METHOD OF MANUFACTURING DISPLAY PANEL AND THE DISPLAY PANEL

FIELD OF INVENTION

The present invention relates to a field of display technology, and more particularly to a method of manufacturing a display panel and a display panel.

BACKGROUND OF INVENTION

Liquid crystal displays (LCDs) realize displaying by encapsulating liquid crystals between an array substrate and a color filter substrate as well as by controlling the energization of each pixel, so that the liquid crystals are twisted to control the passage of backlights. Since the liquid crystal encapsulation requires a sealant frame, the LCDs have certain limitations for a borderless display and a mosaic display, Compared with LCDs, OLEDs and micro LEDs display through panel self-illumination technology, there is no need to encapsulate backlight and upper/lower substrates. Theoretically, a borderless display and a seamless mosaic display can be achieved.

Organic light-emitting diodes (OLEDs) and micro LEDs do not need borders for encapsulating, but in accordance with driving requirements, it is necessary to arrange wirings and binding positions at the periphery of the display area, so that the area outside the display area also appears on the panel, so the borderless display and the seamless mosaic display cannot be achieved. A double-sided process for glass is a technology that integrates wirings and positions of binding area, etc. outside the display area of the panel into a back side of the display panel, which can effectively realize a comprehensive screen display, a borderless display, a seamless mosaic display and other display technologies.

The technical problem is that a technology of a double-sided process for glass requires to perform film formation, exposure, development and etching process, etc. on both sides of the glass, which increases the manufacturing difficulty on the basis of the existing single-sided process. After the preparation of one side (front) of the glass is finished, the protection of front film layers is a difficulty during the preparation of the other side (back) of the glass. The existing method is usually to attach a protective adhesive or a protective film on the front side of the glass after the preparation of the front side of the glass is finished, but the protective adhesive and the protective film often leave adhesive residue because of the subsequent deprotection process, and since the glass transition temperature of the organic film such as the protective adhesive and the protective film is low, it is not conductive to the subsequent process (such as physical vapor deposition or chemical vapor deposition) for the back side of the glass.

Therefore, it is urgent to provide a new method of manufacturing a display panel and a display panel, which can provide a protective film when the double-sided process is performed, and does not affect subsequent processes such as physical vapor deposition or chemical vapor deposition after the protective film is removed.

SUMMARY OF INVENTION

An object of the present invention is to provide a method of manufacturing a display panel and a display panel manufactured by the method. When the preparation of a front side of the display panel is finished, a structure composed of a protective layer, a sacrificial layer, a planarization layer, and a passivation layer is introduced as a protective film. The protective film structure does not contaminate vacuum equipment such as CVD or PVD. Moreover, the protective film structure has characteristics of hardness and abrasion resistance, so it does not produce stripping residual on the conveyor and does not interfere with the manufacturing process for the back side of the display panel.

In order to achieve the above objectives, the present invention provides a method of manufacturing a display panel, including:
 providing an array substrate;
 depositing a protective layer on the array substrate;
 depositing a sacrificial layer on the protective layer;
 depositing a planarization layer on the sacrificial layer;
 depositing a passivation layer on the planarization layer;
 flipping the array substrate;
 depositing and patterning a metal wiring at a side of the array substrate away from the protective layer;
 depositing a dielectric layer at the side of the array substrate away from the protective layer and covering the metal wiring by the dielectric layer;
 forming a transparent electrode at a side of the dielectric layer away from the array substrate and connecting the transparent electrode with the metal wring;
 coating a photoresist at the side of the dielectric layer away from the array substrate and covering the transparent electrode by the photoresist;
 flipping the array substrate again; and
 removing the passivation layer, the planarization layer, the sacrificial layer,
 the protective layer, and the photoresist.

Further, a material of the protective layer includes silicon nitride, silicon oxide, aluminum oxide, or hafnium oxide.

Further, a material of the sacrificial layer is hydrogenated-amorphous silicon.

Further, a material of the planarization layer includes high temperature resistant polyimide, silica gel, or acrylic.

Further, a material of the passivation layer includes silicon nitride, silicon oxide, aluminum oxide, or hafnium oxide.

Further, a material of the dielectric layer includes silicon nitride, silicon oxide, aluminum oxide, or hafnium oxide.

Further, after the step of depositing the dielectric layer at the side of the array substrate away from the protective layer and covering the metal wiring by the dielectric layer, the method further including:
 forming a via within the dielectric layer, the via running through the dielectric layer up to a surface of the metal wiring, and the transparent electrode connected to the metal wiring through the via.

Further, the step of removing the passivation layer the planarization layer, the sacrificial layer, the protective layer, and the photoresist, the passivation layer and the planarization layer are removed by means of Laser Lift-Off (LLO), the sacrificial layer and the protective layer are removed by means of dry-etching, and the photoresist is removed by soaking in a stripping solution.

The present invention further provides a display panel, manufactured by the method of manufacturing the display panel.

Further, the display panel includes: an array substrate, further comprising:
 a substrate;
 a thin film transistor layer, disposed at a side of the substrate;
 a pixel electrode disposed on the thin film transistor layer and connected with the thin film transistor layer;

a metal wiring, disposed at a back side of the array substrate;

a dielectric layer disposed on the metal wiring and adhered to the back side of the array substrate; and a transparent electrode disposed on the dielectric layer and connected with the metal wiring.

The beneficial effect is that the present invention provides a method of manufacturing a display panel and a display panel. A structure composed of the protective layer, the sacrificial layer, the planarization layer, and the passivation layer is introduced as a protective film in the preparation of the front side of the display panel. The protective film structure does not contaminate vacuum equipment such as CVD or PVD. Moreover, the protective film structure has characteristics of hardness and abrasion resistance, so it does not produce residual stripper on the conveyor and does not interfere with the manufacturing process for the back side of the display panel. Moreover, the flatness of a surface of the film layers formed by CVD and coating machine is conducive to transfer and adsorption. The protective film may be completely removed by the means of LLO and dry-etching. The method of the process can effectively realize a double-sided process for single glass.

DESCRIPTION OF DRAWINGS

In order to clearly illustrate technical solution in the embodiment of the present invention, a brief description of drawings used in the embodiments would be given as below. Obviously, the drawings in the following description are merely some embodiments of the present invention. For persons skilled in this art, other drawings can be obtained from these drawings under the premise of the creative labor without paying.

Figure 1:
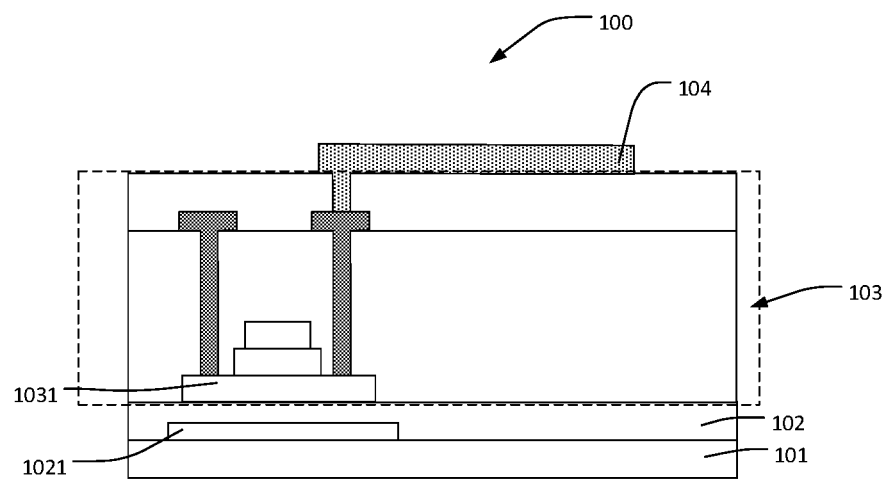
FIG. 1 is a schematic structural diagram showing an array substrate according to the present invention.
Figure 2:
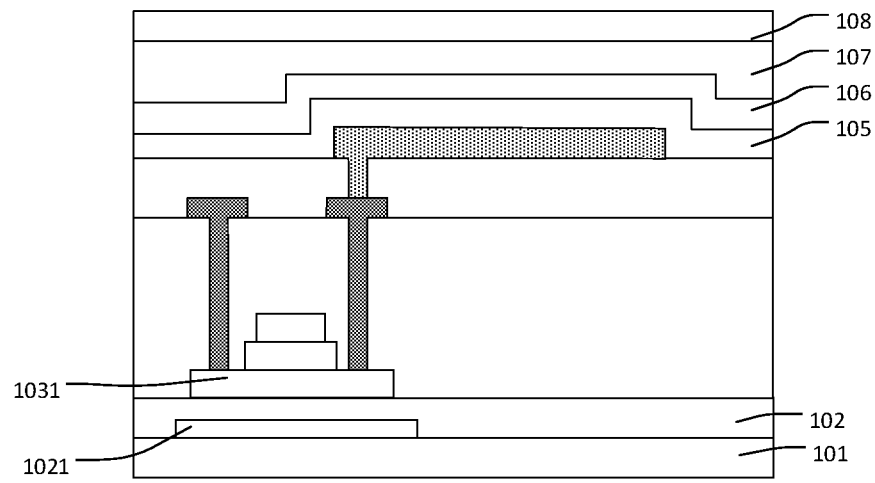
FIG. 2 is a schematic structural diagram showing a protective layer, a sacrificial layer, a planarization layer, and a passivation layer of a display panel according to the present invention.

An array substrate 100; a substrate 101; a buffer layer 102; a thin film transistor layer 103; a pixel electrode 104; an active layer 1031; a shielding layer 1021; a protective layer 105; a sacrificial layer 106; a passivation layer 108; a planarization layer 107; a metal wiring 109; a dielectric layer 110; a transparent electrode 111; a photoresist 112; a via 1101.

DETAILED DESCRIPTION OF PREFERRED EMBODIMENTS

The following descriptions for the respective embodiments are specific embodiments capable of being implemented for illustrating the present disclosure with referring to the appending drawings. The spatially relative terms mentioned in the present invention, such as "upper", "lower", "front", "back", "left", "right", "inner", "outer", "lateral" are only directions referring to the appending drawings. The components names mentioned in the present invention, such as "first" and "second" are only used to distinguish different components and only for better expressed. In the drawings, units with similar structure are represented by the same label.

The present invention provides a method of manufacturing a display panel. In one embodiment, the method specifically includes the following steps:

Step 1: providing an array substrate 100, as shown in FIG. 1. The array substrate 100 includes a substrate 101, a thin film transistor layer 103, and a pixel electrode 104.

A buffer layer 102 is disposed between the substrate 101 and the thin film transistor layer 103. A shielding layer 1021 is provided in the buffer layer 102 and is disposed correspondingly to the thin film transistor layer 103.

The thin film transistor layer 103 is disposed on the array substrate 100, and the thin film transistor is a top-gate structure. The thin film transistor 103 is provided with an active layer 1031. A material of the active layer 1031 includes IGZO, ZnO, ZTO, IGZTO, a-Si, LTPS, and carbon nanotubes.

The pixel electrode 104 is disposed at a side of the thin film transistor layer 103 away from the substrate 101, and the pixel electrode 104 is connected to the thin film transistor layer 103.

Step 2: depositing a protective layer 105 on the array substrate 100. Specifically, the protective layer 105 is disposed on the thin film transistor layer 103 and covers the pixel electrode 104. The protective layer 105 is used as a protective layer for the pixel electrode 104.

A material of the protective layer 105 includes silicon nitride, silicon oxide, aluminum oxide, or hafnium oxide.

Step 3: depositing a sacrificial layer 106 on the protective layer 105. Specifically, the sacrificial layer 106 is disposed at a side of the protective layer 105 away from the thin film transistor layer 103.

A material of the sacrificial layer 106 is hydrogenated-amorphous silicon.

Step 4: depositing a planarization layer 107 on the sacrificial layer 106. A material of the planarization layer 107 includes high temperature resistant polyimide, silica gel, or acrylic.

The planarization layer 107 is used to planarize the sacrificial layer 106. It is conductive to transfer and adsorption during the preparation of the display panel.

Step 5: coating a passivation layer 108 on the planarization layer 107. A material of the passivation layer 108 includes silicon nitride, silicon oxide, aluminum oxide, or hafnium oxide.

The passivation layer 108 may be of a single-layer structure or a multi-layer structure for isolating and protecting the planarization layer 107.

A protective film structure composed of the protective layer 105, the sacrificial layer 106, the planarization layer 107, and the passivation 108 is introduced in the preparation of a front side of the display panel of the present invention. The protective film structure does not contaminate vacuum equipment such as CVD or PVD. Moreover, the protective film structure has characteristics of hardness and abrasion resistance, so it does not produce residual stripper on the conveyor and does not interfere with the manufacturing process for a back side of the panel.

Figure 3:
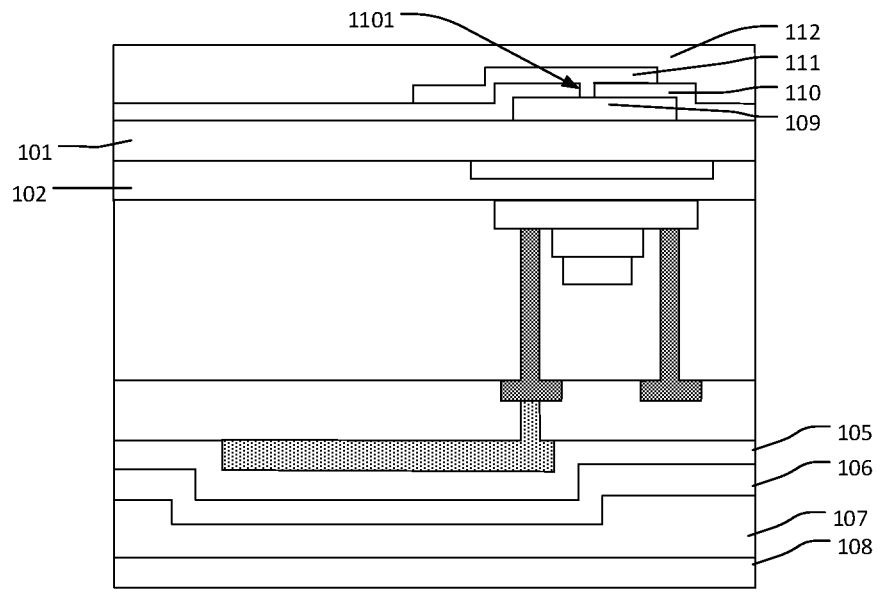
FIG. 3 is a schematic structural diagram showing a metal wiring, a dielectric layer, and a transparent electrode of the display panel according to the present invention.

Step 6: flipping the array substrate 100 and manufacturing the back side of the display panel, as shown in FIG. 3.

Step 7: depositing and patterning a metal wiring 109 at a side of the array substrate 100 away from the protective layer 105. Specifically, the metal wiring 109 is disposed at a side of the substrate 101 away from the thin film transistor layer 103.

Step 8: depositing a dielectric layer 110 at the side of the array substrate 100 away from the protective layer 105 and covering the metal wiring 109 by the dielectric layer 110.

A material of the dielectric layer 110 includes silicon nitride, silicon oxide, aluminum oxide, or hafnium oxide.

After the step of depositing the dielectric layer 110 at the side of the array substrate 100 away from the sacrificial layer 106 and covering the metal wiring 109 by the dielectric layer 110, the method further includes forming a via 1101 within the dielectric layer 110, the via 1101 running through the dielectric layer 110 up to a surface of the metal wiring 109.

Step 9: forming a transparent electrode 111 at a side of the dielectric layer 110 away from the array substrate 100, and the transparent electrode 111 connected to the metal wiring 109 through the via 1101.

Step 10: coating a photoresist 112 at the side of the dielectric layer 110 away from the array substrate 100 and covering the transparent electrode 111 by the photoresist 112. The photoresist 112 is used to protect the metal wiring 109 from the influence of subsequent processes.

Step 11: flipping the array substrate 100 again.

Figure 4:
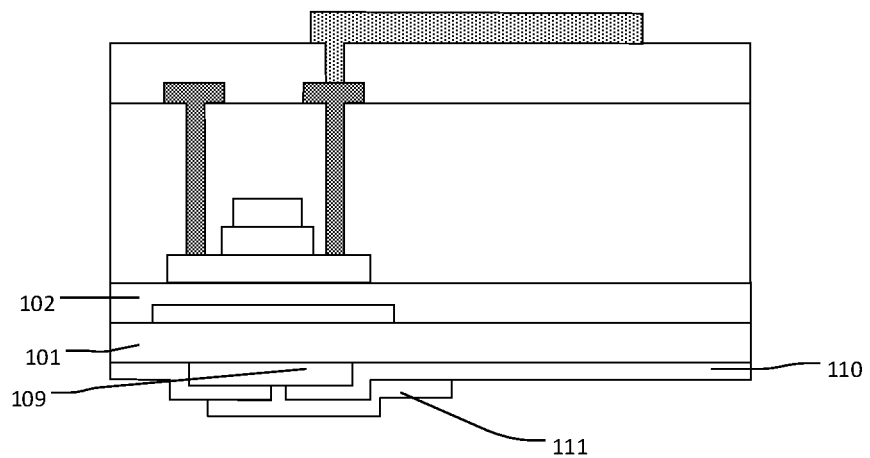
FIG. 4 is a schematic structural diagram showing a display panel manufactured by a method of manufacturing the display panel according to the present invention.

Step 12: removing the passivation layer 108, the planarization layer 107, the sacrificial layer 106, the protective layer 105, and the photoresist 112, and forming the display panel as shown in FIG. 4.

In the step of removing the passivation layer 108 and the planarization layer 107, the passivation layer 108 and the planarization layer 107 are removed by means of Laser Lift-Off (LLO).

In the step of removing the sacrificial layer 106 and the protective layer 105, the sacrificial layer 106 and the protective layer 105 are removed by means of dry-etching.

In the step of removing the photoresist 112, the photoresist 112 is removed by soaking in a stripping solution.

The present invention provides a method of manufacturing a display panel. A structure composed of the protective layer 105, a sacrificial layer 106, a planarization layer 107, and a passivation layer 108 is introduced as a protective film in the preparation of the front side of the display panel. The protective film structure does not contaminate vacuum equipment such as CVD or PVD. Moreover, the protective film structure has characteristics of hardness and abrasion resistance, so it does not produce residual stripper on the conveyor and does not interfere with the manufacturing process for the back side of the display panel. Moreover, the flatness of a surface of film layers formed by CVD and coating machine is conducive to transfer and adsorption. The protective film may be completely removed by the means of LLO and dry-etching. The method of the process can effectively realize the double-sided process for single glass.

As shown in FIG. 4, the present invention further provides a display panel manufactured by the method of manufacturing the display panel.

The display panel includes a substrate 101, a thin film transistor layer 103, a pixel electrode 104, a metal wiring 109, a dielectric layer 110, and a transparent electrode 111.

At a front side of the substrate 101, the thin film transistor layer 103 is disposed at a side of the substrate 101, the pixel electrode 111 is disposed at a side of the thin film transistor layer 103 away from the substrate 101 and connected with the thin film transistor layer 103. Specifically, the pixel electrode 111 is connected to a drain of the thin film transistor layer 103.

At a back side of the substrate 101, the metal wiring 109 is disposed at a side of the substrate 101 away from the thin film transistor layer 103, the dielectric layer 110 is disposed on the substrate 101 and the metal wiring 109, the transparent electrode 111 is disposed on the dielectric layer 110 and connected to the metal wiring 109.

The technical scope of the present invention is not only limited to the content of the description. For persons skilled in this art, various modifications and alterations can be made without departing from the principles of the present invention, and the modifications and the alterations should be considered as a scope of the present invention.

What is claimed is:

1. A method of manufacturing a display panel, comprising:
    providing an array substrate;
    depositing a protective layer at a front side of the array substrate;
    depositing a sacrificial layer on the protective layer;
    coating a planarization layer on the sacrificial layer;
    depositing a passivation layer on the planarization layer;
    flipping the array substrate;
    depositing and patterning a metal wiring at a side of the array substrate away from the protective layer;
    depositing a dielectric layer at the side of the array substrate away from the protective layer and covering the metal wiring by the dielectric layer;
    forming a transparent electrode at a side of the dielectric layer away from the array substrate and connecting the transparent electrode with the metal wring;
    coating a photoresist at the side of the dielectric layer away from the array substrate and covering the transparent electrode by the photoresist;
    flipping the array substrate again; and
    removing the passivation layer, the planarization layer, the sacrificial layer, the protective layer, and the photoresist; wherein the removing of the passivation layer, the planarization layer, the sacrificial layer, the electrode protective layer, and the photoresist comprises: removing the passivation and the planarization layer by means of Laser Lift-Off (LLO); removing the sacrificial layer and the electrode protective layer by means of dry-etching; and removing the photoresist by soaking with a stripping solution.

2. The method as claimed in claim 1, wherein a material of the protective layer comprises silicon nitride, silicon oxide, aluminum oxide, or hafnium oxide.

3. The method as claimed in claim 1, wherein a material of the sacrificial layer is hydrogenated-amorphous silicon.

4. The method as claimed in claim 1, wherein a material of the planarization layer comprises high temperature resistant polyimide, silica gel, or acrylic.

5. The method as claimed in claim 1, wherein a material of the passivation layer comprises silicon nitride, silicon oxide, aluminum oxide, or hafnium oxide.

6. The method as claimed in claim 1, wherein a material of the dielectric layer comprises silicon nitride, silicon oxide, aluminum oxide, or hafnium oxide.

7. The method as claimed in claim 1, wherein the depositing of the dielectric layer at the side of the array substrate away from the protective layer and covering the metal wiring by the dielectric layer, the method further comprises:
    forming a via within the dielectric layer, the via running through the dielectric
    layer up to a surface of the metal wiring, and the transparent electrode connected with the metal wiring through the via.

8. A display panel, manufactured by the method of manufacturing the display panel as claimed in claim 1.

9. The display panel as claimed in claim 8, comprising:
    an array substrate, further comprising:

a substrate;
a thin film transistor layer, disposed at a side of the substrate;
a pixel electrode, disposed on the thin film transistor layer and connected with a drain of the thin film transistor layer;
a metal wiring disposed at a back side of the array substrate;
a dielectric layer disposed on the metal wiring and adhered to the back side of the array substrate; and
a transparent electrode disposed on the dielectric layer and connected with the metal wiring.

* * * * *